United States Patent
Chen

(10) Patent No.: US 7,948,073 B2
(45) Date of Patent: May 24, 2011

(54) THREE-DIMENSIONAL PACKAGE

(75) Inventor: Jen-Chung Chen, Taipei County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 260 days.

(21) Appl. No.: 12/406,969

(22) Filed: Mar. 19, 2009

(65) Prior Publication Data
US 2010/0171204 A1     Jul. 8, 2010

(30) Foreign Application Priority Data
Jan. 5, 2009   (TW) .............................. 98100098 A

(51) Int. Cl.
*H01L 23/02* (2006.01)
(52) U.S. Cl. ................. 257/686; 257/777; 257/E23.085
(58) Field of Classification Search .................. 257/686, 257/777, 784, E23.085
See application file for complete search history.

(56) References Cited

U.S. PATENT DOCUMENTS

| | | | | |
|---|---|---|---|---|
| 6,433,422 | B1 * | 8/2002 | Yamasaki | 257/725 |
| 6,531,784 | B1 * | 3/2003 | Shim et al. | 257/777 |
| 2005/0133897 | A1 * | 6/2005 | Baek et al. | 257/686 |

* cited by examiner

*Primary Examiner* — Phat X Cao
(74) *Attorney, Agent, or Firm* — Winston Hsu; Scott Margo

(57) ABSTRACT

A three-dimensional package includes a carrier, a first die mounted on a first surface of the carrier, and a second die stacked on the first die. The first die includes first bond pads and second bond pads juxtaposed in separate two rows within a central region of the first die. The package further includes first bond fingers disposed on the first surface along a first side of the carrier, and second bond fingers along a second side opposite to the first side. A first bond wire is bonded to one of the first bond pads and extends to one the first bond fingers. The first bond wire overlies the row of the second bond pads. A second bond wire is bonded to one of the second bond pads and extends to one the second bond fingers. The second bond wire overlies the row of the first bond pads.

10 Claims, 3 Drawing Sheets

US 7,948,073 B2

THREE-DIMENSIONAL PACKAGE

BACKGROUND OF THE INVENTION

1. Field of the Invention

The present invention relates to a three-dimensional memory chip package structure. More particularly, the present invention relates to a three-dimensional memory chip package structure having zigzag-arranged, dual-row bond pad layout on the die thereof.

2. Description of the Prior Art

As known in the art, the bond pads of a memory chip are ordinarily designed and disposed at a central region of the chip and are arranged side by side in two rows in order to accommodate conventional window ball grid array (wBGA) configuration for single-die packaging. FIG. 1 is a schematic, cross-sectional view showing a typical wBGA package structure. As shown in FIG. 1, a die is flipped face-down and mounted on a substrate having a window therein. The bond pads A and bond pads B of the die, which are arranged in two rows in a side-by-side manner, are wire bonded to respective bond pads on a bottom surface of the substrate through the window. The bond pads A and bond pads B are electrically connected the corresponding solder balls A and B by way of circuit tracing formed in the substrate. Further, it is known that the package bailout of DDR-SDRAM package or module has to consist with the JEDEC standards.

The industry has developed various DRAM package technologies in recent years. For example, three-dimensional package technology utilizing wire bonding can be employed in high-capacity DRAM modules. FIG. 2 is a schematic, cross-sectional diagram illustrating a conventional three-dimensional memory module 1. As show in FIG. 2, the three-dimensional memory module 1 comprises a die 20 mounted face-up on a carrier substrate 10 and a die 30 stacked on the die 20. The die 20 is affixed to the carrier substrate 10 using an adhesive layer 42. The die 30 is affixed on the die 20 using an adhesive layer 52. The bond pad A denoted by numeral number 22 of the die 20 is electrically connected to the bond finger 102 on a top surface 10a of the carrier substrate 10 through the bone wire 122, while the bond pad B denoted by numeral number 24 is electrically connected to the bond finger 104 on a top surface 10a of the carrier substrate 10 through the bone wire 124. Likewise, the bond pad A denoted by numeral number 32 of the die 30 is electrically connected to the bond finger 102 on a top surface 10a of the carrier substrate 10 through the bone wire 132, while the bond pad B denoted by numeral number 34 is electrically connected to the bond finger 104 on a top surface 10a of the carrier substrate 10 through the bone wire 134.

As aforementioned, since the package bailout of DDR-SDRAM module has to consist with the JEDEC standards, a longer wire tracing path 106 in the carrier substrate 10 is required to electrically connect the corresponding bond pad A denoted by numeral number 22 or 32 to the solder ball A on the bottom surface 10b of the carrier substrate 10 and a longer wire tracing path 108 in the carrier substrate 10 is required to electrically connect the bond pad B denoted by numeral number 24 or 34 to the corresponding solder ball B on the bottom surface 10b of the carrier substrate 10. The longer wire tracing paths 106 and 108 result in decreased chip performance in terms of increase of resistance, inductance or capacitance, and increased signal noise.

In light of the above, there is a strong need in this industry to provide an improved three-dimensional DRAM packaging technology in order to solve the above-mentioned problems.

SUMMARY OF THE INVENTION

It is one objective of the present invention to provide a novel three-dimensional package structure with zigzag-arranged, dual-row bond pad layout on the chip or die, thereby significantly reducing the length of the internal wire tracing and improving the chip performance.

According to the claimed invention, a three-dimensional package structure includes a carrier substrate; a first die mounted on a first surface of the carrier substrate, wherein the first die comprises first-row bond pads and second-row bond pads located at a central region of the die; a second die stacked on the first die; first bond fingers disposed along a first side of the carrier substrate and disposed on the first surface, wherein the second-row bond pads is proximate to the first bond fingers with respect to the first-row bond pads; second bond fingers disposed along a second side of the carrier substrate and disposed on the first surface, wherein the second side is opposite to the first side, and the first-row bond pads is proximate to the second bond fingers with respect to the second-row bond pads; first bond wires bonding, across the second-row bond pads, between the first-row bond pads and the first bond fingers; and second bond wires bonding, across the first-row bond pads, between the second-row bond pads and the second bond fingers.

From one aspect of the present invention, a semiconductor package structure includes a carrier substrate; a die mounted on a first surface of the carrier substrate, wherein the die comprises first-row bond pads and second-row bond pads located at a central region of the die; first bond fingers disposed along a first side of the carrier substrate and disposed on the first surface; second bond fingers disposed along a second side of the carrier substrate and disposed on the first surface, wherein the first side is opposite to the second side; first bond wires extending, across the second-row bond pads, between the first-row bond pads and the first bond fingers; second bond fingers extending, across the first-row bond pads, between the second-row bond pads and the second bond fingers; first solder balls located on a second surface of the carrier substrate, wherein the first solder balls are proximate to the first bond fingers; and second solder balls located on the second surface of the carrier substrate, wherein the second solder balls are proximate to the second bond fingers.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
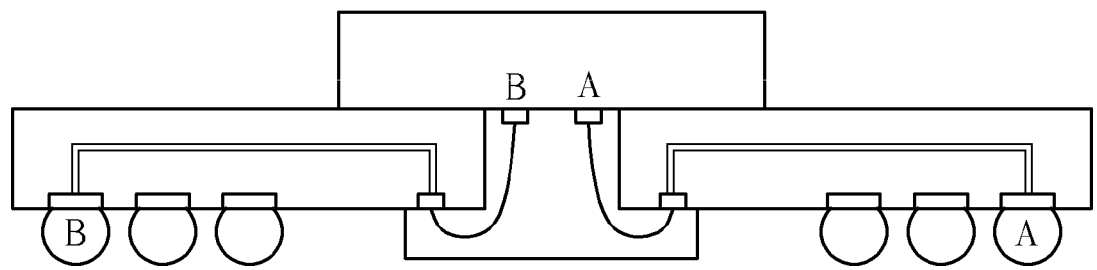
FIG. 1 is a schematic, cross-sectional view showing a typical wBGA package structure.
Figure 2:
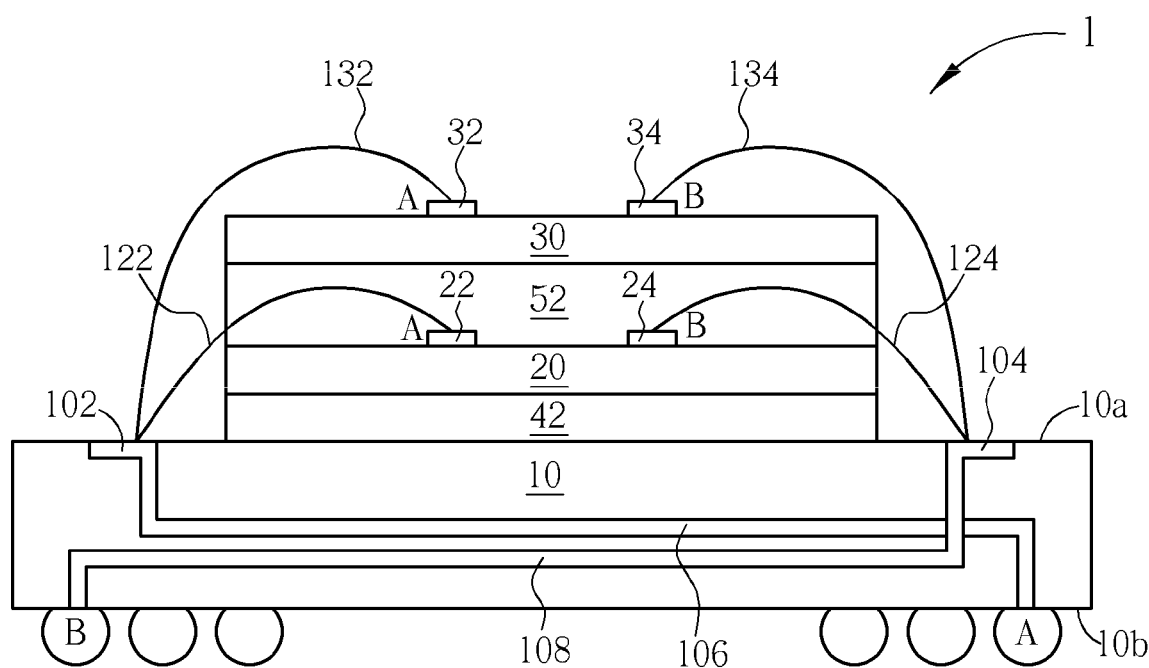
FIG. 2 is a schematic, cross-sectional diagram illustrating a conventional three-dimensional memory module.
Figure 3:
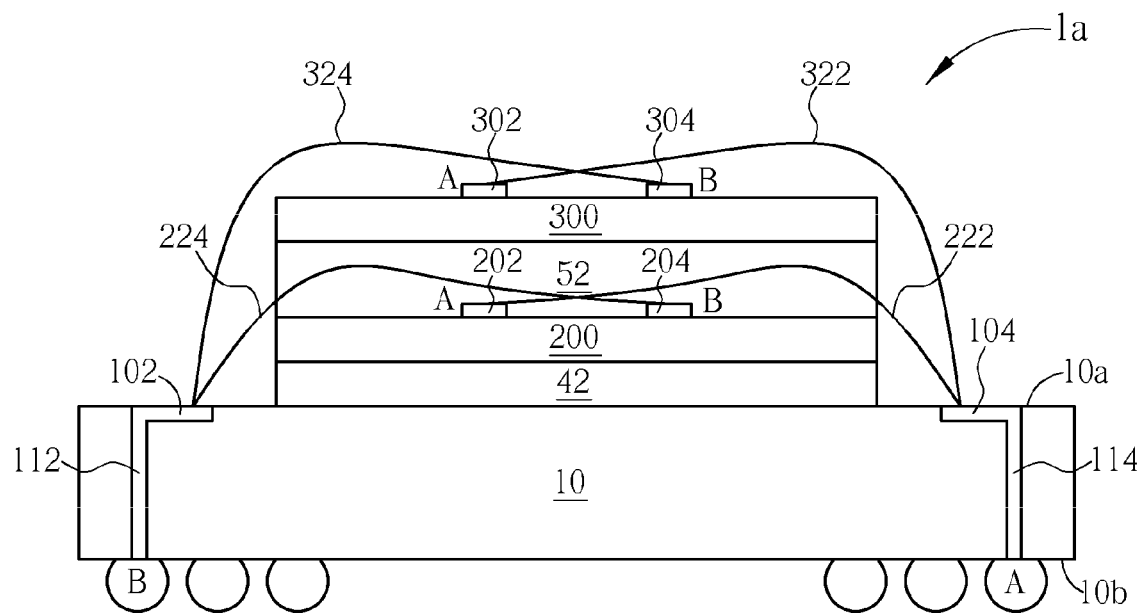
FIG. 3 is a schematic, cross-sectional diagram illustrating a three-dimensional memory module in accordance with one preferred embodiment of this invention.

FIG. 3 is a schematic, cross-sectional diagram illustrating a three-dimensional memory module 1a in accordance with one preferred embodiment of this invention, wherein like numeral numbers designate like elements, layers or regions. As shown in FIG. 3, the three-dimensional memory module 1a comprises a die 200 mounted on a carrier substrate 10 and a die 300 stacked on the die 200. Both of the die 200 and die 300 have a dual-row bond pad layout that is disposed at a central region of each of the die 200 and die 300. Likewise, the die 200 is affixed to the carrier substrate 10 using an adhesive layer 42, and the die 300 is affixed to the die 200 using an adhesive layer 52. On the bottom surface 10b of the carrier substrate 10, a plurality of solder balls, which are arranged in matrix according to package bailout rule of DDR-SDRAM module consisting with the JEDEC standards, are provided. The plurality of solder balls include solder balls A and solder balls B, which correspond to the bond pads A and B on the die respectively. A row of bond fingers 102 and a row of bond fingers 104 are provided on the top surface 10a of the carrier substrate 10, wherein the row of bond fingers 102 and the row of bond fingers 104 are disposed along two opposite sides of the four sides of the carrier substrate 10.

It is one germane feature of this invention that the bond pads A arranged in the first row on the left-hand side of the die 200, which are denoted by numeral number 202 in FIG. 3, are wire bonded, across the bond pads B (denoted by numeral number 204) of the die 200, to the bond fingers 104 on the top surface 10a of the carrier substrate 10 through bond wire 222. The bond pads B arranged in the second row on the right-hand side of the die 200, which are denoted by numeral number 204, are wire bonded, across the bond pads A of the die 200, to the bond fingers 102 on the top surface 10a of the carrier substrate 10 through bond wire 224. The bond pads A arranged in the first row on the left-hand side of the die 300, which are denoted by numeral number 302 in FIG. 3, are wire bonded, across the bond pads B (denoted by numeral number 304) of the die 300, to respective bond fingers 104 on the top surface 10a of the carrier substrate 10 through bond wire 322. The bond pads B arranged in the second row on the right-hand side of the die 300, which are denoted by numeral number 304, are wire bonded, across the bond pads A of the die 300, to the bond fingers 102 on the top surface 10a of the carrier substrate 10 through bond wire 324.

Since the bond fingers 104 are proximate to the corresponding solder balls A located on the bottom surface 10b of the carrier substrate 10 and the bond fingers 102 are proximate to the corresponding solder balls B located on the bottom surface 10b of the carrier substrate 10, the bond pads A (denoted by 202 in FIG. 3) of the die 200 can be electrically connected to the corresponding solder balls A in a much shorter length of wire tracing path 114 and the bond pads B (denoted by 204 in FIG. 3) of the die 200 can be electrically connected to the corresponding solder balls B in a much shorter length of wire tracing path 112. By virtue of the decrease of the length of the internal wire tracing in the carrier substrate 10, the chip performance can be significantly improved.

Figure 4:
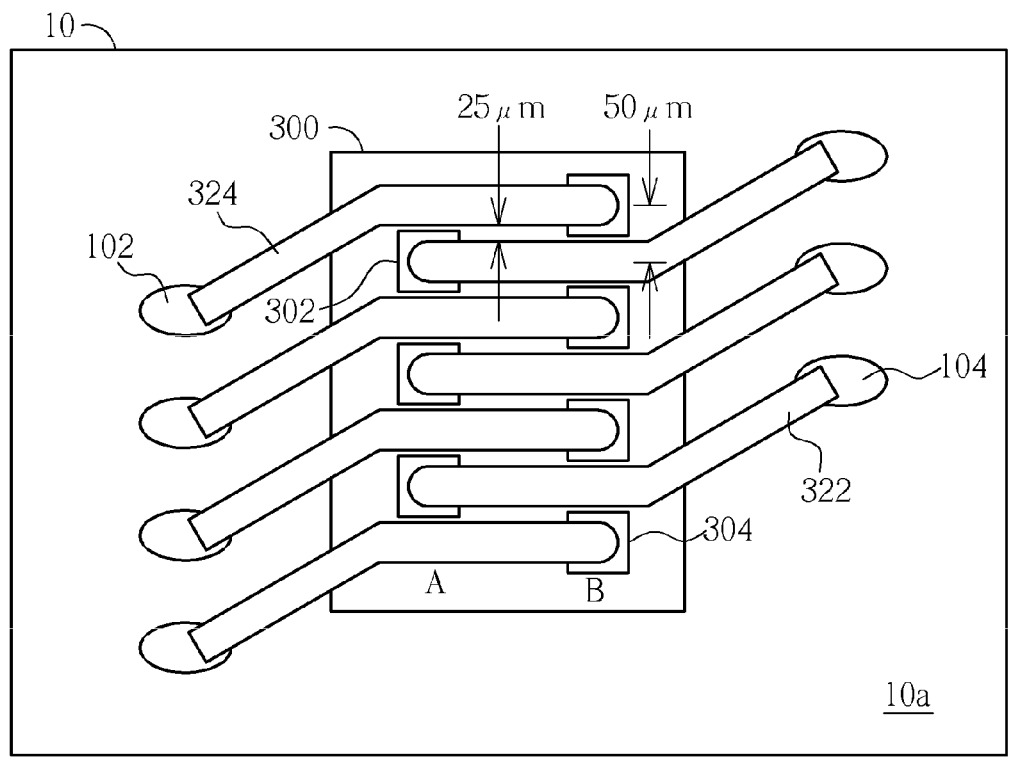
FIG. 4 is a schematic top view of the three-dimensional memory module of FIG. 3.

In order to implement the three-dimensional memory module 1a as depicted in FIG. 3, the die 200 and the die 300 have different bond pad layout. Please refer to FIG. 4. FIG. 4 is a schematic top view of the three-dimensional memory module 1a of FIG. 3. For the sake of clarity, only die 300 is shown in FIG. 4 and the die size is not drawn to scale. It is understood that the die 200 has the dual-row bond pad layout that is similar to that of the die 300 without departing from the spirit of this invention. As shown in FIG. 4, the bond pad A 302 in the first row and the bond pad B 304 in the second row of the die 300 are arranged in a zigzag manner at the central region of the die 300. The pitch between the bond pads in the same row is minimized to accommodate the shrinking die size according to this invention. However, the decreased pitch between the bond pads may result in undesired intersection and contact between bond wires during wire bonding process. To avoid this, the bond fingers 102 and 104 are longitudinally shifted in one direction and the bond wires 322 and 324 are bent at a specific angle before bonding to the respective bond fingers 102 and 104. For example, the bond fingers 102 on the carrier substrate 10 are shifted in a first direction, while the bond fingers 104 on the carrier substrate 10 are shifted in a second direction opposite to the first direction. It is another germane feature that the three-dimensional memory module 1a comprises bent bond wires 322 and 324 as shown in FIG. 4.

Further, the prior art carrier substrates typically have larger bond fingers, for example, a dimension of about 250 µm×150 µm, for increasing the throughput of the carrier substrate engineering. According to this invention, the bond fingers on the carrier substrate may have the same pitch as that of the dual-row bond pads of the die, and may be designed with a reduced dimension of about 250 µm×70 µm for example, for accommodating the zigzag-arranged, dual-row bond pad layout of the die, thereby implementing the three-dimensional package utilizing wire bonding technology and successfully achieving the goal of reducing the length of wire tracing in the carrier substrate.

Figure 5:
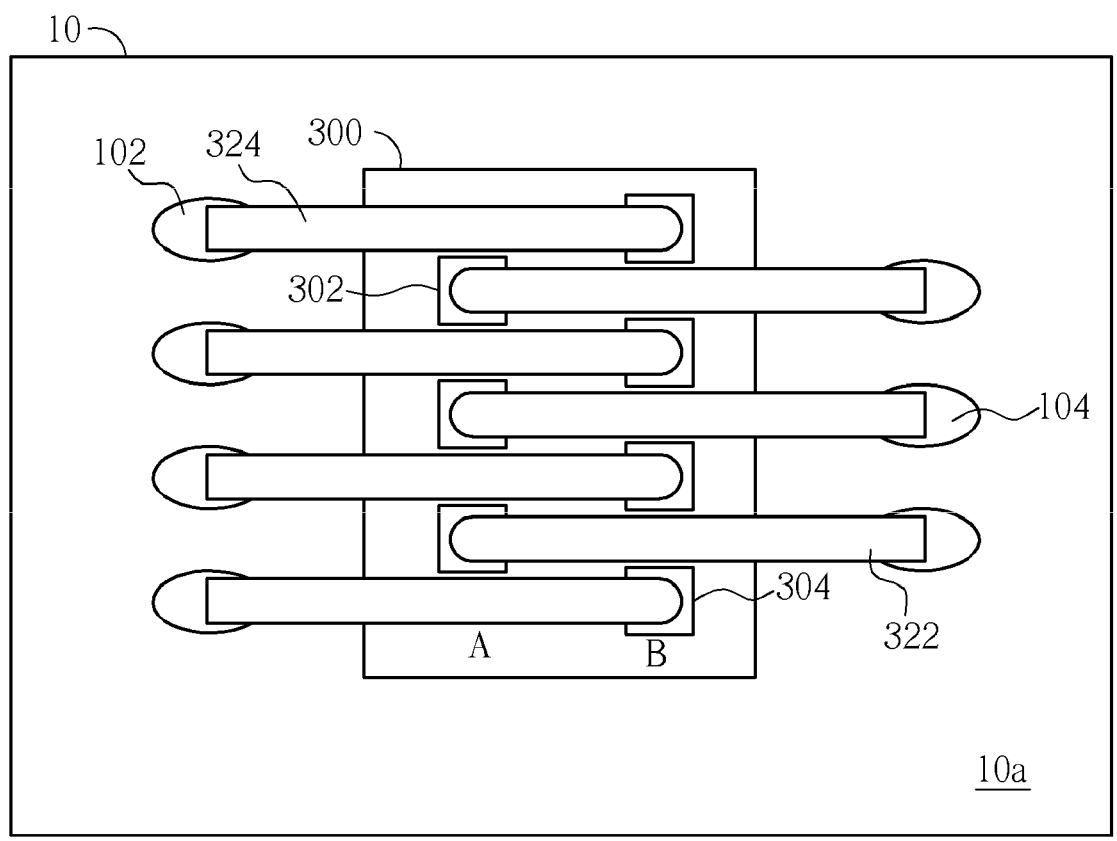
FIG. 5 is a schematic top view of a memory package module in accordance with another embodiment of this invention.

Please refer to FIG. 5. FIG. 5 is a schematic top view of a memory package module in accordance with another embodiment of this invention, wherein like numeral numbers designate like elements, layers or regions. As shown in FIG. 5, the bond pads A 302 in the first row and the bond pads B 304 in the second row of the die 300 are arranged in a zigzag manner. The difference between the structure of FIG. 5 and the structure of FIG. 4 is that the bond wires 322 and 324 are not bent during the wire bonding process. That is, the bond wires 322 and 324 are substantially in parallel with each other.

To sum up, the present invention includes at least the following advantages and features. First, the length of the internal wire tracing is greatly reduced (at least two-fold to three-fold reduction). Second, the chip performance in terms of resistance, inductance and capacitance is significantly improved due to the decreased wire tracing length of the package. Third, by virtue of the wire bonding technology, the cost of the three-dimensional package is saved.

Those skilled in the art will readily observe that numerous modifications and alterations of the device and method may be made while retaining the teachings of the invention.

What is claimed is:

1. A three-dimensional package structure, comprising:
   a carrier substrate;
   a first die mounted on a first surface of the carrier substrate, wherein the first die comprises first-row bond pads and second-row bond pads located at a central region of the die;
   a second die directly stacked on the first die, wherein the first die and the second die are mounted on the same side of the carrier substrate;
   first bond fingers disposed along a first side of the carrier substrate and disposed on the first surface, wherein the second-row bond pads is proximate to the first bond fingers with respect to the first-row bond pads;
   second bond fingers disposed along a second side of the carrier substrate and disposed on the first surface, wherein the second side is opposite to the first side, and the first-row bond pads is proximate to the second bond fingers with respect to the second-row bond pads;

first bond wires bonding, across the second-row bond pads, between the first-row bond pads and the first bond fingers; and second bond wires bonding, across the first-row bond pads, between the second-row bond pads and the second bond fingers.

2. The three-dimensional package structure according to claim 1 wherein the second die comprises third-row bond pads and fourth-row bond pads.

3. The three-dimensional package structure according to claim 2 wherein the three-dimensional package structure comprises third bond wires bonding, across the fourth-row bond pads, between the third-row bond pads and the first bond fingers.

4. The three-dimensional package structure according to claim 3 wherein the three-dimensional package structure comprises fourth bond wires bonding, across the third-row bond pads, between the fourth-row bond pads and the second bond fingers.

5. The three-dimensional package structure according to claim 1 wherein the three-dimensional package structure further comprises first solder balls and second solder balls located on a second surface of the carrier substrate, and wherein the first solder balls are proximate to the first bond fingers, while the second solder balls are proximate to the second bond fingers.

6. The three-dimensional package structure according to claim 5 wherein the first solder balls are electrically connected to the first bond fingers through a first internal wire trace, and the second solder balls are electrically connected to the second bond fingers through a second internal wire trace.

7. The three-dimensional package structure according to claim 1 wherein the first-row bond pads and the second-row bond pads are arranged in a zigzag manner.

8. A semiconductor package structure, comprising:
a carrier substrate;
a die having a bottom side mounted on a first surface of the carrier substrate, wherein the die comprises first-row bond pads and second-row bond pads located at a central region on an active side of the die;
first bond fingers disposed along a first side edge of the carrier substrate and disposed on the first surface;
second bond fingers disposed along a second side edge of the carrier substrate and disposed on the first surface, wherein the first side edge is opposite to the second side edge;
first bond wires extending, across the second-row bond pads, between the first-row bond pads and the first bond fingers, and beyond a first edge of the die;
second bond wires extending, across the first-row bond pads, between the second-row bond pads and the second bond fingers, and beyond a second edge of the die;
first solder balls located on a second surface of the carrier substrate, wherein the first solder balls are proximate to the first bond fingers; and
second solder balls located on the second surface of the carrier substrate, wherein the second solder balls are proximate to the second bond fingers.

9. The semiconductor package structure according to claim 8 wherein the first solder balls are electrically connected to the first bond fingers through a first internal wire trace, and the second solder balls are electrically connected to the second bond fingers through a second internal wire trace.

10. The semiconductor package structure according to claim 8 wherein the first-row bond pads and the second-row bond pads are arranged in a zigzag manner.

\* \* \* \* \*